(12) United States Patent
Lee

(10) Patent No.: US 10,351,480 B2
(45) Date of Patent: Jul. 16, 2019

(54) MULTILAYER ENVIRONMENTAL BARRIER COATINGS

(71) Applicant: Rolls-Royce Corporation, Indianapolis, IN (US)

(72) Inventor: Kang N. Lee, Strongsville, OH (US)

(73) Assignee: Rolls-Royce Corporation, Indianapolis, IN (US)

(*) Notice: Subject to any disclaimer, the term of this patent is extended or adjusted under 35 U.S.C. 154(b) by 337 days.

(21) Appl. No.: 15/424,041

(22) Filed: Feb. 3, 2017

(65) Prior Publication Data

US 2017/0144939 A1    May 25, 2017

Related U.S. Application Data

(63) Continuation of application No. 14/178,437, filed on Feb. 12, 2014, now Pat. No. 9,598,777.

(Continued)

(51) Int. Cl.
| | |
|---|---|
| B32B 18/00 | (2006.01) |
| C04B 41/52 | (2006.01) |
| C23C 28/04 | (2006.01) |
| C23C 16/40 | (2006.01) |
| C04B 41/89 | (2006.01) |

(Continued)

(52) U.S. Cl.
CPC ............ *C04B 41/52* (2013.01); *C01B 33/20* (2013.01); *C04B 35/00* (2013.01); *C04B 35/14* (2013.01); *C04B 35/62222* (2013.01); *C04B 41/009* (2013.01); *C04B 41/4515* (2013.01); *C04B 41/4527* (2013.01); *C04B 41/4529* (2013.01); *C04B 41/5024* (2013.01); *C04B 41/5032* (2013.01); *C04B 41/5035* (2013.01); *C04B 41/89* (2013.01); *C09D 1/00* (2013.01); *C23C 4/11* (2016.01); *C23C 14/08* (2013.01); *C23C 16/40* (2013.01); *C23C 28/042* (2013.01); *C04B 2235/3217* (2013.01); *C04B 2235/3244* (2013.01); *C04B 2235/3418* (2013.01); *C04B 2235/3427* (2013.01); *C04B 2235/428* (2013.01); *F01D 5/288* (2013.01); *F01D 25/005* (2013.01); *F05D 2220/32* (2013.01); *F05D 2300/6033* (2013.01)

(58) Field of Classification Search
None
See application file for complete search history.

(56) References Cited

U.S. PATENT DOCUMENTS

| | | |
|---|---|---|
| 5,391,404 A | 2/1995 | Lee et al. |
| 5,496,644 A | 3/1996 | Lee et al. |

(Continued)

FOREIGN PATENT DOCUMENTS

| | | |
|---|---|---|
| WO | 2012027442 A1 | 3/2012 |
| WO | 2012129431 A1 | 9/2012 |

OTHER PUBLICATIONS

International Search Report and Written Opinion for counterpart international application No. PCT/US2014/015955. dated Jun. 5, 2014. 9 pp.

(Continued)

*Primary Examiner* — Seth Dumbris
(74) *Attorney, Agent, or Firm* — Shumaker & Sieffert, P.A.

(57) ABSTRACT

A method of making a multilayer environmental barrier coating for a ceramic matrix composite is provided, comprising the steps of: plasma spray coating an oxide-based bond coat over top of the ceramic matrix composite and depositing a columnar top coat over the oxide-based bond coat.

9 Claims, 1 Drawing Sheet

Related U.S. Application Data

(60) Provisional application No. 61/777,054, filed on Mar. 12, 2013.

(51) Int. Cl.

| | | |
|---|---|---|
| *C04B 41/00* | (2006.01) |
| *C23C 14/08* | (2006.01) |
| *C23C 4/11* | (2016.01) |
| *C01B 33/20* | (2006.01) |
| *C04B 35/00* | (2006.01) |
| *C04B 35/14* | (2006.01) |
| *C04B 35/622* | (2006.01) |
| *C04B 41/45* | (2006.01) |
| *C04B 41/50* | (2006.01) |
| *C09D 1/00* | (2006.01) |
| *F01D 5/28* | (2006.01) |
| *F01D 25/00* | (2006.01) |

(56) References Cited

U.S. PATENT DOCUMENTS

| | | |
|---|---|---|
| 6,284,325 B1 | 9/2001 | Eaton, Jr. et al. |
| 6,410,148 B1 | 6/2002 | Eaton, Jr. et al. |
| 6,558,814 B2 | 5/2003 | Spitsberg et al. |
| 6,759,151 B1 | 7/2004 | Lee |
| 6,887,594 B2 | 5/2005 | Li et al. |
| 7,354,651 B2 | 4/2008 | Hazel et al. |
| 7,429,424 B2 | 9/2008 | Boutwell et al. |
| 7,442,444 B2 | 10/2008 | Hazel et al. |
| 7,544,394 B2 | 6/2009 | Boutwell et al. |
| 8,039,113 B2 | 10/2011 | Kirby et al. |
| 8,119,247 B2 | 2/2012 | Kirby et al. |
| 2003/0027012 A1 | 2/2003 | Spitsberg et al. |
| 2003/0180571 A1 | 9/2003 | Singh |
| 2006/0246319 A1 | 11/2006 | Bye et al. |
| 2006/0280952 A1 | 12/2006 | Hazel et al. |
| 2008/0124479 A1 | 5/2008 | Hazel et al. |
| 2009/0162561 A1 | 6/2009 | Kirby et al. |
| 2009/0178413 A1 | 7/2009 | Lee |
| 2009/0252985 A1 | 10/2009 | Nagaraj et al. |
| 2010/0129636 A1 | 5/2010 | Cybulsky et al. |
| 2010/0159150 A1 | 6/2010 | Kirby et al. |
| 2010/0159151 A1 | 6/2010 | Kirby et al. |
| 2010/0255289 A1 | 10/2010 | Lewinsohn et al. |
| 2014/0272168 A1 | 9/2014 | Lee |
| 2014/0272169 A1 | 9/2014 | Lee |

OTHER PUBLICATIONS

International Preliminary Report on Patentability from counterpart International Application No. PCT/US2014/015955, dated Sep. 24, 2015, 7pp.

Prosecution History from U.S. Appl. No. 14/178,437, dated May 22, 2015 through Nov. 9, 2016, 43 pp.

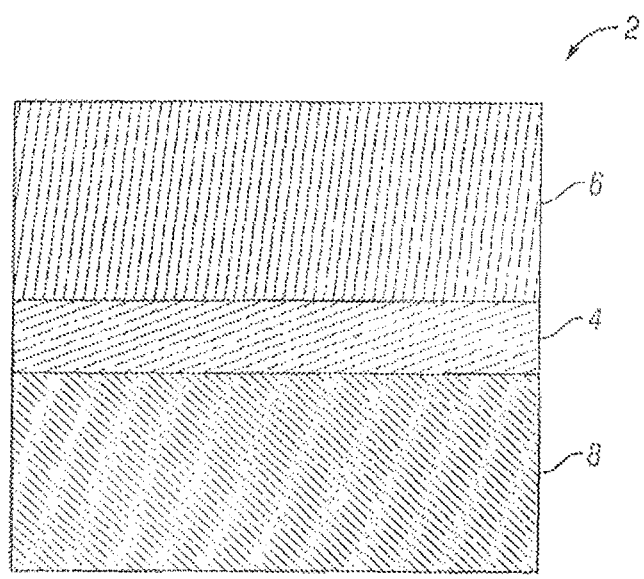

MULTILAYER ENVIRONMENTAL BARRIER COATINGS

RELATED APPLICATIONS

This application is a continuation of U.S. patent application Ser. No. 14/178,437, filed Feb. 12, 2014, which claims priority to U.S. Provisional Patent Application Ser. No. 61/777,054, filed on Mar. 12, 2013. The contents of U.S. patent application Ser. No. 14/178,437 and U.S. Provisional Patent Application Ser. No. 61/777,054 are hereby expressly incorporated by reference in their entirety.

SUMMARY

This present disclosure relates to methods of fabricating multilayer environmental barrier coatings for substrates such as ceramic matrix composites, and in particular, to methods of fabrication that include the combination of plasma spraying and either electron beam physical vapor deposition or directed vapor deposition.

An illustrative embodiment of the present disclosure includes a method of making a multilayer environmental barrier coating for a ceramic matrix composite, comprising the steps of: plasma spray coating an oxide-based bond coat over top of the ceramic matrix composite; selecting a method of applying a columnar top coat over the oxide-based bond coat, wherein the method of applying the columnar top coat is selected from the group consisting of electron beam physical vapor deposition and directed vapor deposition; and depositing a columnar top coat over the oxide-based bond coat according to the selected method of applying the columnar top coat.

In the above and other embodiments, the method of making the multilayer, environmental barrier coating may further include: selecting the method of applying the columnar top coat, being decided by evaluating the benefits and detriments of either the electron beam physical vapor deposition and the directed vapor deposition methods and how those benefits and detriments affect the columnar top coat when sprayed on the oxide-based bond coat; the oxide-based bond coat is selected from the group consisting of mullite, mullite +Si, $HfSiO_4+SiO_2+Si$, $HfSiO_4+SiO_2+Al_2O_3+Si$, $RE_2Si_2O_7+Al_2O_3+Si$, $RE_2Si_2O_7+Al_2O_3+SiO_2+Si$, $HfSiO_4+Al_2O_3+Si$, $HfSiO_4+Si$, and $SiO_2+Al_2O_3+Si$, (wherein RE is selected from the group consisting of at least one of lutetium, ytterbium, thulium, erbium, holmium, dysprosium, terbium, gadolinium, europium, samarium, promethium, neodymium, praseodymium, cerium, lanthanum, yttrium, and scandium), the columnar top coat is selected from the group consisting of $RE_2Si_2O_7$ and $RE_2SiO_5$ (wherein RE is selected from the group consisting of at least one of lutetium, ytterbium, thulium, erbium, holmium, dysprosium, terbium, gadolinium, europium, samarium, promethium, neodymium, praseodymium, cerium, lanthanum, yttrium, and scandium), $RE_2O_3$-stabilized $ZrO_2$ (wherein RE is selected from the group consisting of at least one of lutetium, ytterbium, thulium, erbium, holmium, dysprosium, terbium, gadolinium, europium, samarium, promethium, neodymium, praseodymium, cerium, lanthanum, yttrium, and scandium), and $RE_2O_3$-stabilized $HfO_2$ (wherein RE is selected from the group consisting of at least one of lutetium, ytterbium, thulium, erbium, holmium, dysprosium, terbium, gadolinium, europium, samarium, promethium, neodymium, praseodymium, cerium, lanthanum, yttrium, and scandium); the oxide-based bond coat being the mullite +Si, wherein the Si is present in an amount between about 10 wt % and about 40 wt %, with the balance being mullite; the oxide-based bond coat being the $HfSiO_4+SiO_2+Si$, wherein the Si is present in an amount between about 10 wt % and about 40 wt %, the $SiO_2$ is present in an amount between about 10 wt % and about 30 wt %, and the balance being $HfSiO_4$; the oxide-based bond coat being the $HfSiO_4+SiO_2+Al_2O_3+Si$, wherein the Si is present in an amount between about 10 wt % and about 40 wt %, the $SiO_2$ is present in an amount between about 10 wt % and about 30 wt %, the $Al_2O_3$ is present in an amount between about 0.1 wt % and about 10 wt %, and the balance being $HfSiO_4$; the oxide-based bond coat being the $RE_2Si_2O_7+Al_2O_3+Si$, wherein the Si is present in an amount between about 10 wt % and about 40 wt %, the $Al_2O_3$ is present in an amount between about 0.1 wt % and about 10 wt %, and the balance being $RE_2Si_2O_7$; the oxide-based bond coat being the $RE_2Si_2O_7+Al_2O_3+SiO2+Si$, wherein the Si is present in an amount between about 10 wt % and about 40 wt %, the $SiO_2$ is present in an amount between about 10 wt % and about 30 wt %, the $Al_2O_3$ is present in an amount between about 0.1 wt % and about 10 wt %, and the balance being $RE_2Si_2O_7$; the oxide-based bond coat being the $SiO2+Al_2O_3+Si$, wherein the Si is present in an amount between about 10 wt % and about 40 wt %, the $Al_2O_3$ is present in an amount between about 0.1 wt % and about 10 wt %, and the balance being $SiO_2$; the oxide-based bond coat being $HfSiO_4+Al_2O_3+Si$; wherein the Si is present in an amount between about 10 wt % and about 40 wt %, the $Al_2O_3$ is present in an amount between about 0.1 wt % and about 10 wt %, and the balance is $HfSiO_4$; and the oxide-based bond coat being $HfSiO_4+Si$, wherein the Si is present in an amount between about 10 wt % and about 40 wt %, and the balance being $HfSiO_4$.

Additional features and advantages of these methods will become apparent to those skilled in the art upon consideration of the following detailed description of the illustrated embodiment exemplifying the best mode of carrying out these methods as presently perceived.

BRIEF DESCRIPTION OF DRAWINGS

The present disclosure will be described hereafter with reference to the attached drawing which is given as a non-limiting example only, in which:

FIG. 1 is a cross-sectional diagram of a ceramic matrix composite material with an oxide-based bond coat deposited thereon and a columnar top coat deposited on the oxide-based bond coat.

The exemplification set out herein illustrates embodiments of the methods and such exemplification is not to be construed as limiting the scope of the methods in any manner.

DETAILED DESCRIPTION

This present disclosure is directed to methods of fabricating multilayer environmental barrier coatings (EBCs) to suit the characteristics of certain materials such as Silicon-containing ceramics including ceramic matrix composites (CMCs). Plasma spraying, electron beam physical vapor deposition (EB-PVD), or directed vapor deposition (DVD) are three methods of coating CMCs.

Each deposition method has its own benefits and detriments. One embodiment may use plasma spraying and electron beam physical vapor deposition. Another embodiment may use plasma spraying and directed vapor deposition. By combining layers using these different methods, the benefits of each create distinctive properties to the coatings. For example, an EBC may be formed by combining a plasma sprayed layer which provides the capability to fabricate complex chemistry coatings, with a layer formed by either DVD or EB-PVD which provides the capability to fabricate highly strain-tolerant columnar microstructures and smooth surface finishes. The results are high performance EBCs with a multiple oxide-based bond coat having >2700F temperature capability and a top coat having ~3000F temperature capability. The following table identifies the benefits and detriments of the various coating processes.

| Process | Benefits | Detriments |
|---|---|---|
| Plasma Spraying | Amenability to complex coating chemistries Relatively low manufacturing cost | Inability to coat non-line-of-sight areas Rough coating surface finish Low deposition efficiency Low erosion resistance |
| EB-PVD (Conventional) | Smooth coating surface finish Ability to create highly strain-tolerant columnar microstructures High erosion resistance | Inability to coat non-line-of-sight areas Difficulty in fabricating complex coating chemistries Low deposition efficiency High manufacturing cost |
| DVD (Enhanced EB-PVD) | Smooth coating surface finish Ability to create highly strain-tolerant columnar microstructures Ability to coat non-line-of-sight areas High deposition efficiency High erosion resistance | Difficulty in fabricating complex coating chemistries High manufacturing cost, but likely lower than conventional EB-PVD |

The benefits of plasma spraying include amenability to complex coating chemistries and relatively low manufacturing cost, while its detriments include the inability to coat non-line-of-sight areas, rough coating surface finish, low deposition efficiency, and low erosion resistance. In contrast, the benefits of EB-PVD include smooth coating surface finish, ability to create highly strain-tolerant columnar microstructures and high erosion resistance. Its detriments include an inability to coat non-line-of-sight areas, difficulty in fabricating complex coating chemistries, low deposition efficiency and high manufacturing cost. The DVD (or enhanced EB-PVD) has non-line-of-sight coating capabilities and improved deposition efficiency as compared to conventional EB-PVD.

Again, the fabrication method for each coating layer is selected by considering the benefits and detriments of each process in conjunction with the complexity of the chemistry and the function of each layer. EB-PVD or DVD may be used for the top coat of airfoils because of their smooth surface finish for aerodynamic performance and better erosion resistance as compared to plasma spraying. EB-PVD or DVD may also be used for layers with high coefficient of thermal expansion (CTE) mismatch with CMC. Layers having high CTE mismatch with CMC may cause high residual stresses and therefore experience short thermal cycling life. CTE mismatch stresses can be significantly mitigated by creating a highly strain tolerant columnar microstructure using the EB-PVD or DVD processes. Plasma spraying may be used for layers with a complex chemistry. Multiple phases react at high temperatures to form glass-containing reaction products that create strong chemical bonding for long steam cycling life.

An illustrative embodiment provides a combination of a plasma-sprayed, complex oxide-based bond coat and either an EB-PVD or DVD-based rare earth silicate, stabilized zirconia or stabilized hafnia top coat. This combination provides the EBCs with a high temperature bond coat with a temperature capability exceeding the temperature capability of current Silicon (Si) bond coats (~2460 F), along with a highly strain-tolerant and water-vapor-resistant, low thermal conductivity top coat. The high temperature bond coat enables the implementation of high temperature CMCs (2700 F CMC) in gas turbines, while the highly strain-tolerant and water-vapor-resistant, low thermal conductivity top coat increases the EBC surface temperature capability to about ~3000 F.

Examples of plasma sprayed layers include oxide-based high temperature bond coats with complex chemistry, such as mullite ($3Al_2O_3-2SiO_2$), mullite +Si, $HfSiO_4+SiO_2+Si$, $HfSiO_4+Al_2O_3+SiO_2+Si$, $RE_2Si_2O_7+Al_2O_3+Si$, $RE_2Si_2O_7+Al_2O_3+SiO2+Si$, $HfSiO_4+Al_2O_3+Si$, $HfSiO_4+Si$, and $SiO_2+Al_2O_3+Si$, (where RE is selected from the group consisting of at least one of lutetium, ytterbium, thulium, erbium, holmium, dysprosium, terbium, gadolinium, europium, samarium, promethium, neodymium, praseodymium, cerium, lanthanum, yttrium, and scandium). When the oxide-based bond coat is mullite +Si—the Si is present in an amount between about 10 wt % and about 40 wt % and the balance is mullite. When the oxide-based bond coat is $HfSiO_4+SiO_2+Si$—the Si is present in an amount between about 10 wt % and about 40 wt %, the $SiO_2$ is present in an amount between about 10 wt % and about 30 wt %, and the balance is $HfSiO_4$. When the oxide-based bond coat is $HfSiO_4+SiO_2+Al_2O_3+Si$—the Si is present in an amount between about 10 wt % and about 40 wt %, the $SiO_2$ is present in an amount between about 10 wt % and about 30 wt %, the $Al_2O_3$ is present in an amount between about 0.1 wt % and about 10 wt %, and the balance is $HfSiO_4$. When the oxide-based bond coat is $RE_2Si_2O_7+Al_2O_3+Si$—the Si is present in an amount between about 10 wt % and about 40 wt %, the $Al_2O_3$ is present in an amount between about 0.1 wt % and about 10 wt %, and the balance is $RE_2Si_2O_7$. When the oxide-based bond coat is $RE_2Si_2O_7+Al_2O_3+SiO_2+Si$—the Si is present in an amount between about 10 wt % and about 40 wt %, the $SiO_2$ is present in an amount between about 10 wt % and about 30 wt %, the $Al_2O_3$ is present in an amount between about 0.1 wt % and about 10 wt %, and the balance is $RE_2Si_2O_7$. When the oxide-based bond coat is $HfSiO_4+Al_2O_3+Si$;—the Si is present in an amount between about 10 wt % and about 40 wt %, the $Al_2O_3$ is present in an amount between about 0.1 wt % and about 10 wt %, and the balance is $HfSiO_4$. When the oxide-based bond coat being $HfSiO_4+Si$—the Si is present in an amount between about 10 wt % and about 40 wt %, and the balance is $HfSiO_4$. Lastly, when the oxide-based bond coat is $SiO2+Al_2O_3+Si$—the Si is present in an amount between about 10 wt % and about 40 wt %, the $Al_2O_3$ is present in an amount between about 0.1 wt % and about 10 wt %, and the balance is $SiO_2$.

Examples of EB-PVD or DVD layers include EBC top coats of rare earth silicate ($RE_2Si_2O_7$ and $RE_2SiO_5$), $RE_2O_3$-stabilized $ZrO_2$ and $RE_2O_3$-stabilized $HfO_2$ (where RE is selected from the group consisting of at least one of lutetium, ytterbium, thulium, erbium, holmium, dysprosium, terbium, gadolinium, europium, samarium, promethium, neodymium, praseodymium, cerium, lanthanum, yttrium, and scandium). Rare earth monosilicate ($RE_2SiO_5$), $RE_2O_3$-stabilized $ZrO_2$ and $RE_2O_3$-stabilized $HfO_2$, have CTEs substantially higher than CMC and therefore are desirable to be fabricated in low modulus, strain tolerant columnar microstructure to mitigate CTE mismatch stresses.

The substrate may include any of the following: a Si-containing ceramic, such as silicon carbide (SiC), silicon nitride ($Si_3N_4$), a CMC having a SiC or $Si_3N_4$ matrix, silicon oxynitride, and silicon aluminum oxynitride; a Si-containing metal alloy, such as molybdenum-silicon alloys (e.g. $MoSi_2$) and niobium-silicon alloys (e.g. $NbSi_2$); and an oxide-oxide CMC. CMCs comprise a matrix reinforced with ceramic fibers, whiskers, platelets, and chopped or continuous fibers.

A cross-sectional diagram of a ceramic matrix composite material with an oxide-based bond coat deposited thereon, and a columnar top coat deposited on the oxide-based bond coat is shown in FIG. 1. An illustrative example of an EBC that combines plasma sprayed, high temperature oxide-based bond coat 4 and either a DVD or EB-PVD processed, highly strain-tolerant columnar top coat 6, on a CMC or other Si-containing ceramic 8. The choice of whether columnar top coat 6 is formed from either DVD or EB-PVD is determined by the particular benefits one or the other imparts, as shown in the table above.

Although the present disclosure has been described with reference to particular means, materials and embodiments, from the foregoing description, one skilled in the art can easily ascertain the essential characteristics of the present disclosure and various changes and modifications may be made to adapt the various uses and characteristics without departing from the spirit and scope of the present invention as set forth in the following claims.

What is claimed is:

1. An article comprising:
   a ceramic matrix composite;
   an oxide-based bond coat over the ceramic matrix composite, wherein the oxide-based bond coat consists of $HfSiO_4+SiO_2+Al_2O_3+Si$, and wherein the Si is present in the oxide-based bond coat in an amount between about 10 wt. % and about 40 wt. %, the $SiO_2$ is present in the oxide-based bond coat in an amount between about 10 wt. % and about 30 wt. %, the $Al_2O_3$ is present in the oxide-based bond coat in an amount between about 0.1 wt. % and about 10 wt. %, and the balance of the oxide-based bond coat is $HfSiO_4$; and
   a top coat over the oxide-based bond coat.

2. The article of claim 1, wherein the top coat is selected from the group consisting of $RE_2Si_2O_7$ and $RE_2SiO_5$ (wherein RE is selected from the group consisting of at least one of lutetium, ytterbium, thulium, erbium, holmium, dysprosium, terbium, gadolinium, europium, samarium, promethium, neodymium, praseodymium, cerium, lanthanum, yttrium, and scandium), $RE_2O_3$-stabilized $ZrO_2$ (wherein RE is selected from the group consisting of at least one of lutetium, ytterbium, thulium, erbium, holmium, dysprosium, terbium, gadolinium, europium, samarium, promethium, neodymium, praseodymium, cerium, lanthanum, yttrium, and scandium), and $RE_2O_3$-stabilized $HfO_2$ (wherein RE is selected from the group consisting of at least one of lutetium, ytterbium, thulium, erbium, holmium, dysprosium, terbium, gadolinium, europium, samarium, promethium, neodymium, praseodymium, cerium, lanthanum, yttrium, and scandium).

3. The article of claim 1, wherein the top coat has a columnar microstructure.

4. An article comprising:
   a ceramic matrix composite;
   an oxide-based bond coat over the ceramic matrix composite, wherein the oxide-based bond coat consists of $HfSiO_4+Al_2O_3+Si$, and wherein the Si is present in the oxide-based bond coat in an amount between about 10 wt. % and about 40 wt. %, the $Al_2O_3$ is present in the oxide-based bond coat in an amount between about 0.1 wt. % and about 10 wt. %, and the balance of the oxide-based bond coat is $HfSiO_4$; and
   a top coat over the oxide-based bond coat.

5. The article of claim 4, wherein the top coat is selected from the group consisting of $RE_2Si_2O_7$ and $RE_2SiO_5$ (wherein RE is selected from the group consisting of at least one of lutetium, ytterbium, thulium, erbium, holmium, dysprosium, terbium, gadolinium, europium, samarium, promethium, neodymium, praseodymium, cerium, lanthanum, yttrium, and scandium), $RE_2O_3$-stabilized $ZrO_2$ (wherein RE is selected from the group consisting of at least one of lutetium, ytterbium, thulium, erbium, holmium, dysprosium, terbium, gadolinium, europium, samarium, promethium, neodymium, praseodymium, cerium, lanthanum, yttrium, and scandium), and $RE_2O_3$-stabilized $HfO_2$ (wherein RE is selected from the group consisting of at least one of lutetium, ytterbium, thulium, erbium, holmium, dysprosium, terbium, gadolinium, europium, samarium, promethium, neodymium, praseodymium, cerium, lanthanum, yttrium, and scandium).

6. The article of claim 4, wherein the top coat has a columnar microstructure.

7. An article comprising:
   a ceramic matrix composite;
   an oxide-based bond coat over the ceramic matrix composite, wherein the oxide-based bond coat consists of $HfSiO_4+Si$; and wherein the Si is present in the oxide-based bond coat in an amount between about 10 wt. % and about 40 wt. %, and the balance of the oxide-based bond coat is $HfSiO_4$; and
   a top coat over the oxide-based bond coat.

8. The article of claim 7, wherein the top coat is selected from the group consisting of $RE_2Si_2O_7$ and $RE_2SiO_5$ (wherein RE is selected from the group consisting of at least one of lutetium, ytterbium, thulium, erbium, holmium, dysprosium, terbium, gadolinium, europium, samarium, promethium, neodymium, praseodymium, cerium, lanthanum, yttrium, and scandium), $RE_2O_3$-stabilized $ZrO_2$ (wherein RE is selected from the group consisting of at least one of lutetium, ytterbium, thulium, erbium, holmium, dysprosium, terbium, gadolinium, europium, samarium, promethium, neodymium, praseodymium, cerium, lanthanum, yttrium, and scandium), and $RE_2O_3$-stabilized $HfO_2$ (wherein RE is selected from the group consisting of at least one of lutetium, ytterbium, thulium, erbium, holmium, dysprosium, terbium, gadolinium, europium, samarium, promethium, neodymium, praseodymium, cerium, lanthanum, yttrium, and scandium).

9. The article of claim 7, wherein the top coat has a columnar microstructure.

* * * * *